(12) United States Patent
Corbo et al.

(10) Patent No.: US 11,235,790 B2
(45) Date of Patent: Feb. 1, 2022

(54) MODULAR RAILROAD TRACK SIMULATOR

(71) Applicant: Siemens Mobility, Inc., New York, NY (US)

(72) Inventors: Mark Corbo, Prospect, KY (US); James Dobson, Louisville, KY (US)

(73) Assignee: Siemens Mobility, Inc., New York, NY (US)

( * ) Notice: Subject to any disclaimer, the term of this patent is extended or adjusted under 35 U.S.C. 154(b) by 229 days.

(21) Appl. No.: 16/622,303

(22) PCT Filed: Jul. 14, 2017

(86) PCT No.: PCT/US2017/042108
§ 371 (c)(1),
(2) Date: Dec. 13, 2019

(87) PCT Pub. No.: WO2019/013815
PCT Pub. Date: Jan. 17, 2019

(65) Prior Publication Data
US 2021/0146980 A1    May 20, 2021

(51) Int. Cl.
*B61L 27/00* (2006.01)
*B61L 29/22* (2006.01)
*G01R 35/00* (2006.01)

(52) U.S. Cl.
CPC ......... *B61L 27/0055* (2013.01); *B61L 29/226* (2013.01); *G01R 35/005* (2013.01)

(58) Field of Classification Search
CPC .. G01R 35/005; B61L 29/226; B61L 27/0055
See application file for complete search history.

(56) References Cited

U.S. PATENT DOCUMENTS 4,932,615 A * 6/1990 Frazier ...................... B61L 1/20
246/121
5,841,620 A * 11/1998 Masghati ............... H02H 9/044
361/119

(Continued)

FOREIGN PATENT DOCUMENTS

WO      2009026971 A1    3/2009

OTHER PUBLICATIONS

Elenco, Resistance Substitution Box Instruction Manual, Elenco Electronics, Inc, accessed on Sep. 25, 2021 at https://www.robotshop.com/media/files/pdf/elenco-rs-500-manual.pdf (Year: 2001).*

(Continued)

*Primary Examiner* — Michael J Dalbo (57) ABSTRACT

A system for simulating a railroad track. The system comprises one or more modular track simulation units that are smaller than conventional track simulators and are easy to use with and be connected to a device being tested (e.g., grade crossing predictor). Each track simulation unit may have one of a plurality of impedances associated with a corresponding railroad track length. The units are combinable such that the system can simulate multiple, different track lengths. Each unit has a plurality of test points that can be connected to the device under test and/or used to alter conditions of the simulated track.

17 Claims, 7 Drawing Sheets

(56) References Cited

U.S. PATENT DOCUMENTS

2011/0095139 A1\* 4/2011 O'Dell .................... B61L 29/32
                                                           246/293
2017/0030993 A1\* 2/2017 Harp ....................... B61L 29/22

OTHER PUBLICATIONS

PCT International Search Report and Written Opinion of International Searching Authority dated May 29, 2018 corresponding to PCT International Application No. PCT/US2017/042108 filed Jul. 14, 2017.

\* cited by examiner

MODULAR RAILROAD TRACK SIMULATOR

BACKGROUND

1. Field

Embodiments of the invention relate to railroad track simulators and, more particularly, to a modular railroad track simulator.

2. Description of the Related Art

A grade crossing predictor (often referred to as a crossing predictor in the U.S., or a level crossing predictor in the U.K.) is an electronic device that is connected to the rails of a railroad track and is configured to detect the presence of an approaching train and determine its speed and distance from a crossing (i.e., a location at which the tracks cross a road, sidewalk or other surface used by moving objects). The grade crossing predictor will use this information to generate a constant warning time signal for controlling a crossing warning device. A crossing warning device is a device that warns of the approach of a train at a crossing, examples of which include crossing gate arms (e.g., the familiar black and white striped wooden arms often found at highway grade crossings to warn motorists of an approaching train), crossing lights (such as the red flashing lights often found at highway grade crossings in conjunction with the crossing gate arms discussed above), and/or crossing bells or other audio alarm devices. Grade crossing predictors are often (but not always) configured to activate the crossing warning device at a fixed time (e.g., 30 seconds) prior to an approaching train arriving at a crossing.

Typical grade crossing predictors include a transmitter that transmits a signal over a circuit formed by the track's rails and one or more termination shunts positioned at desired approach distances from the transmitter, a receiver that detects one or more resulting signal characteristics, and a logic circuit such as a microprocessor or hardwired logic that detects the presence of a train and determines its speed and distance from the crossing. The approach distance depends on the maximum allowable speed of a train, the desired warning time, and a safety factor. Some embodiments of grade crossing predictors generate and transmit a constant current AC signal on the track circuit; the predictor detects a train and determines its distance and speed by measuring impedance changes caused by the train's wheels and axles acting as a shunt across the rails, which effectively shortens the length (and hence lowers the impedance) of the rails in the circuit. Multiple grade crossing predictors can monitor a given track circuit if each predictor measures track impedance at a different frequency. Measurement frequencies are chosen such that they have a low probability of interfering with each other while also avoiding power line harmonics.

Another type of track circuit is known as an audio frequency overlay (AFO) track circuit. An AFO track circuit uses a transmitter to introduce an audio signal of a specific assigned frequency onto the track through a connection to the track's rails. A receiver that responds only to the specific assigned frequency is also connected to the rails at the other end of the AFO track circuit. AFO track circuits detect the presence of a train through loss of the audio frequency signal when it is shunted by a train on the railroad track.

As is known in the art, there is a need to confirm that grade crossing predictors, AFO and other track circuits are operating properly to ensure public safety at railroad crossings. This type of equipment is typically required to adhere to Federal regulations (e.g., 49 CFR, part 236), specifications listed in industry standards and recommended practices such as those published by the American Railway Engineering and Maintenance-of-Way Association (AREMA). For example, shunt sensitivity is governed by 49 CFR part 236.56, which states that "Each track circuit controlling home signal or approach locking shall be so maintained that track relay is in deenergized position, or device that functions as a track relay shall be in its most restrictive state if, when track circuit is dry, a shunt of 0.06 ohm resistance is connected across the track rails of the circuit, including fouling sections of turnouts."

In addition, the AREMA Communications and Signals Manual of Recommended Practices part 3.1.20-H(3) states that a track system "shall be capable of detecting a rolling track shunt of 0.06 ohms within approach limits determined by terminations and a stationary track shunt of 0.06 ohms within island limits." Part 3.1.20-H(4) states that the system "shall operate with bi-directional or unidirectional approach track circuits." Part 3.1.20-H(6) states that the system "shall be capable of detecting any track circuit discontinuity which could result in reduced warning time within 70% of the approach circuits from the crossing and shall interrupt associated relay drive output while such discontinuity occurs."

Accordingly, grade crossing predictors, AFO and other track circuits should be tested before being installed at a railroad crossing to ensure that they comply with regulations, standards and recommended practices. Current testing techniques often require the use of a track simulator, which simulates the impedance of a railroad track or a portion of the track (e.g., a block length of the railroad track) that the grade crossing predictor, AFO and other track circuits will be connected to. The device to be tested is connected to the simulator and put through simulated operating conditions to see how the device operates based on the impedance and other conditions of the simulated track. However, the current techniques for simulating a railroad track use large devices that are difficult to operate and have only longer distance impedances. By having only larger impedances, the existing simulators are only suitable to simulate fewer track lengths. All of these conditions are undesirable.

SUMMARY

Embodiments disclosed herein provide a system for simulating a railroad track. The system comprises one or more modular track simulation units that are smaller than conventional track simulator devices and are easy to use with and be connected to a device being tested (e.g., grade crossing predictor). Each modular track simulation unit disclosed herein may have one of a plurality of impedances, each associated with a corresponding railroad track length. The units are combinable such that the system can simulate multiple, different track lengths based on the combined impedance of the units. Each unit has a plurality of test points that can be connected to the device under test and/or used to alter conditions of the simulated track.

In one embodiment, a modular railroad track simulation unit is provided. The unit comprises a housing, a first plug formed through one side wall of the housing and a second plug formed through a second sidewall of the housing. A plurality of test points are formed through a top of the housing, a first test point being electrically connected to the first plug and a second test point being electrically connected to the second plug. The unit further comprises at least one device within the housing having an inductance and being electrically connected between the first and second test points at locations within the housing. The inductance defines a railroad track length being simulated by the unit.

In another embodiment, a modular railroad track simulation system is provided. The system comprises a plurality of railroad track simulation modules. Each module comprises a housing, a first plug formed through one side wall of the housing and a second plug formed through a second sidewall of the housing. A plurality of test points are formed through a top of the housing, a first test point being electrically connected to the first plug and a second test point being electrically connected to the second plug. Each module further comprises at least one device within the housing having an inductance and being electrically connected between the first and second test points at locations within the housing. A second plug of a first module of the plurality of modules is connectable to a first plug from a second module of the plurality of modules, and the system simulates a railroad track length based on a combined inductance of the plurality of railroad track simulation modules.

Further areas of applicability of the present disclosure will become apparent from the detailed description, drawings and claims provided hereinafter. It should be understood that the detailed description, including disclosed embodiments and drawings, are merely exemplary in nature intended for purposes of illustration only and are not intended to limit the scope of the invention, its application or use. Thus, variations that do not depart from the gist of the invention are intended to be within the scope of the invention.

BRIEF DESCRIPTION OF THE DRAWINGS

Like reference symbols in the various drawings indicate like elements.

DETAILED DESCRIPTION

The components and materials described hereinafter as making up the various embodiments are intended to be illustrative and not restrictive. Many suitable components and materials that would perform the same or a similar function as the materials described herein are intended to be embraced within the scope of embodiments of the present invention.

Figure 1:
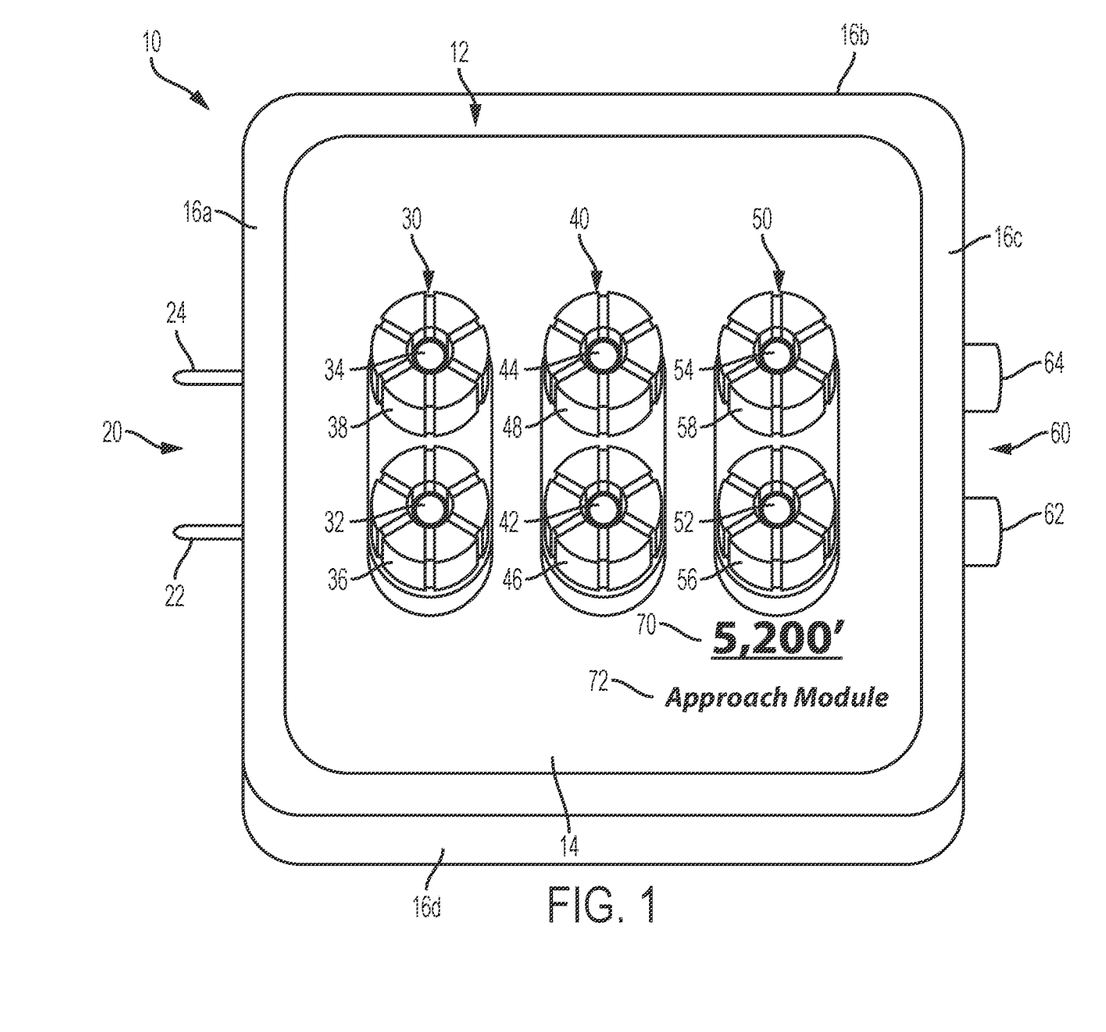
FIG. 1 illustrates an example modular track simulation unit constructed in accordance with the disclosed principles.

FIG. 1 illustrates an example modular track simulation unit 10 constructed in accordance with the disclosed principles. As will become apparent, the unit 10 is configured to simulate a specific length of railroad track by one or more inductances placed within the unit 10. The unit 10 is modular and may connect to other units, simulating the same or different track length, to achieve a system simulating a desired length of track. In addition, the unit 10 will have test points for connections required to interact with a device being tested and/or to change operating conditions for the simulation.

The unit 10 comprises a housing 12 having a top 14, four side walls 16*a*, 16*b*, 16*c*, 16*d* and a bottom (not shown). The housing 12 can be made of plastic or any material suitable for maintaining components on, through or within the housing 12 as disclosed herein. For example, other suitable materials can include e.g., carbon fiber, fiberglass, metal, wood, to name a few. In some implementations, the top 14 can be removable and maintained on the walls 16*a*, 16*b*, 16*c*, 16*d* by a connecting mechanism such as e.g., screws. In addition to, or alternatively, once the unit 10 is configured as explained herein, the top 14 may be secured to the walls 16*a*, 16*b*, 16*c*, 16*d* by an adhesive or other permanent means.

In the illustrated example, the housing is approximately 4.6 inches wide, 4.6 inches in length and 2.4 inches high. It should be appreciated that the disclosed embodiments should not be limited to the exact material used for the housing 12 or the exact dimensions described herein. All this is required is that the housing 12 be able to maintain the components disclosed herein and to be sufficiently durable to e.g., withstand use.

In the illustrated embodiment, the unit 10 contains a male plug 20 comprising a first stud 22 and a second stud 24. In some implementations, the studs 22, 24 can be banana plug studs having first ends that can be fed through respective holes in the first wall 16*a* of the housing 12 and second ends that can be maintained within the housing 12 by screws or other suitable mechanisms such that the studs 22, 24 are held in position with at least a portion of the first ends extending from the first wall 16*a* as shown in FIG. 1. The second ends of the studs 22, 24 will also be connected to other components within the housing 12 as is discussed below in more detail.

In the illustrated embodiment, the unit 10 contains a female plug 60 comprising a first jack 62 and a second jack 64. In some implementations, the jacks 62, 64 can be banana plug jacks having first ends that can be fed through respective holes in the third wall 16*c* of the housing 12 and second ends that can be maintained within the housing 12 by screws or other suitable mechanisms such that the jacks 62, 64 are held in position with at least a portion of the first ends extending from the third wall 16*c* as shown in FIG. 1. The second ends of the jacks 62, 64 will also be connected to other components within the housing 12 as is discussed below in more detail.

Figure 4:
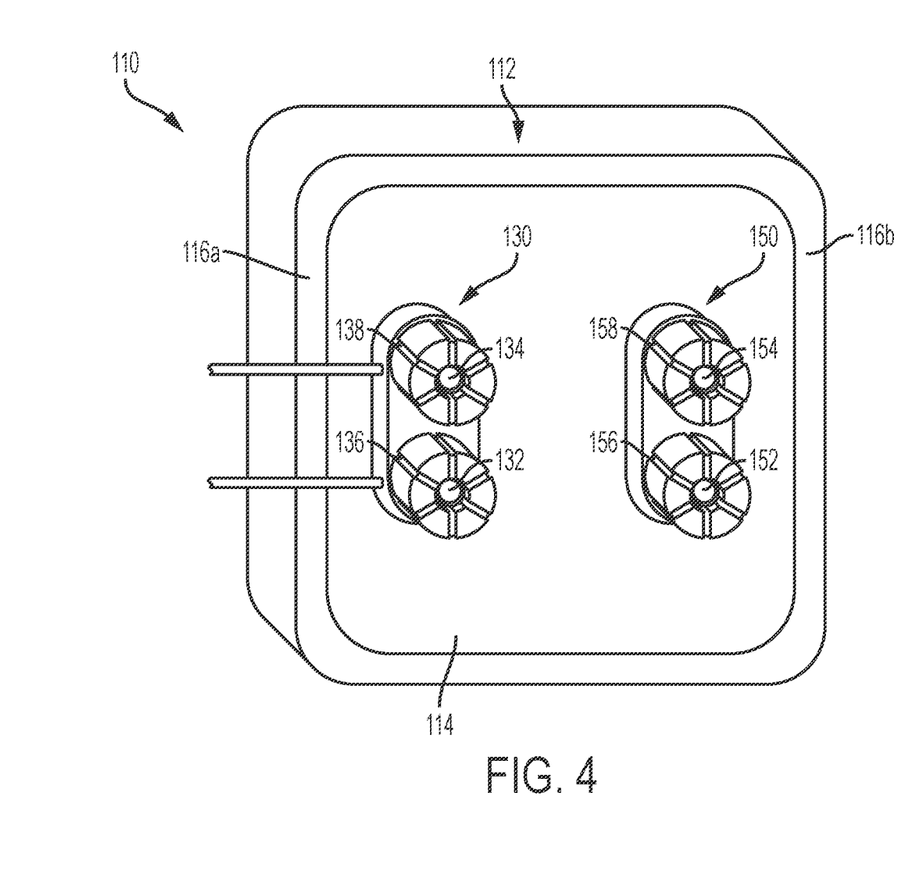
FIG. 4 illustrates another example modular track simulation unit constructed in accordance with the disclosed principles.
Figure 5:
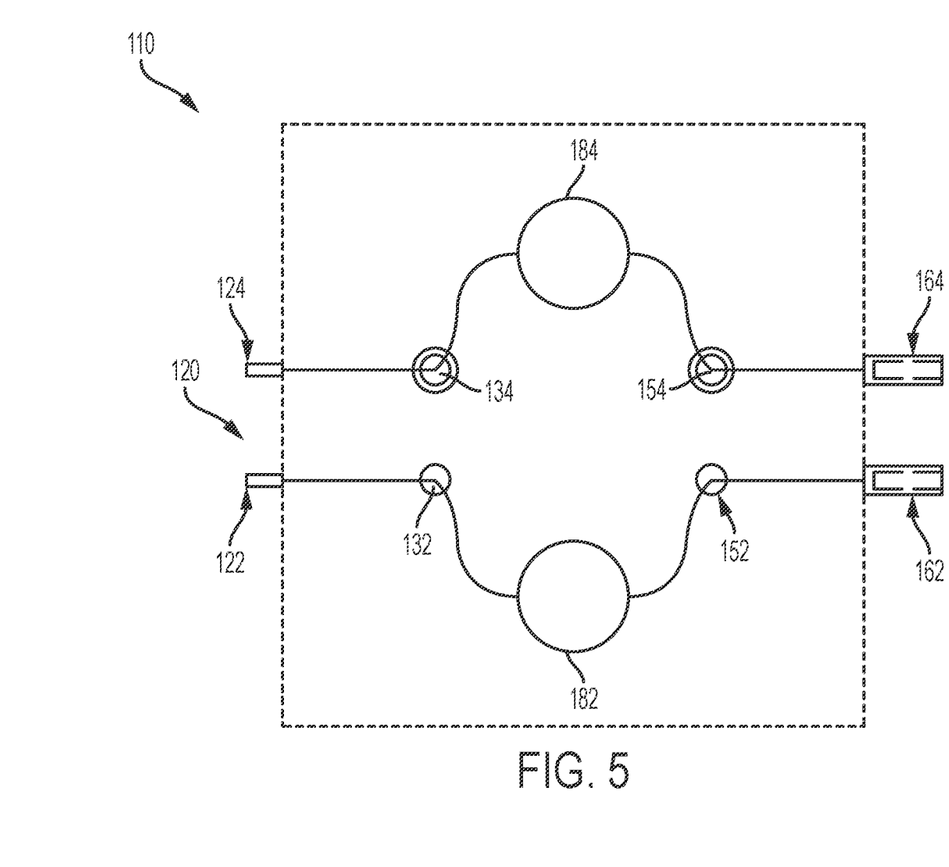
FIG. 5 illustrates example connections between components of the modular track simulation unit illustrated in FIG. 4.
Figure 6:
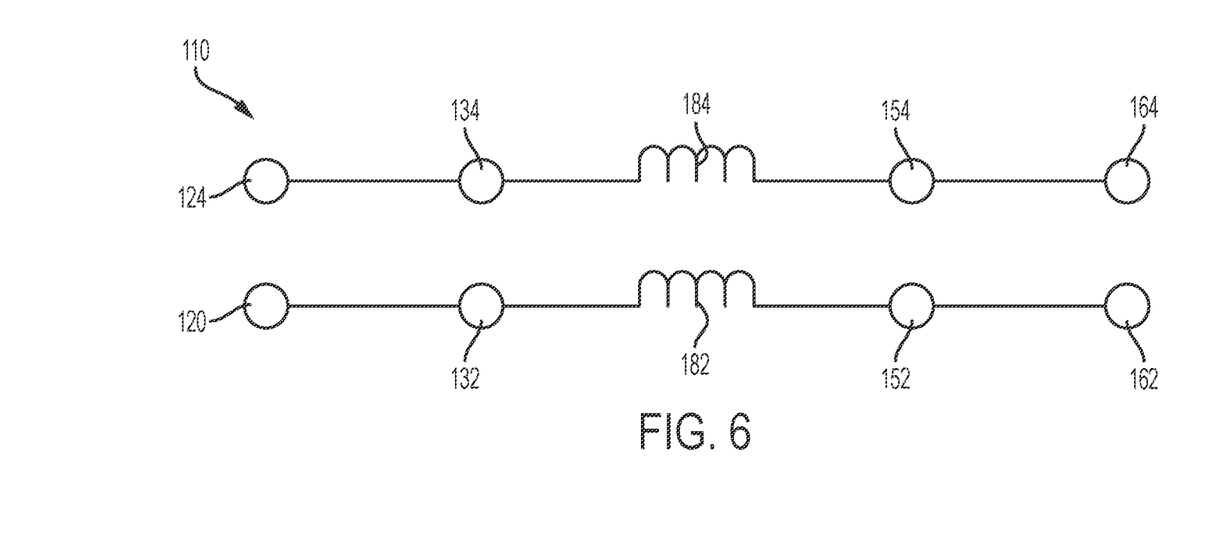
FIG. 6 illustrates an example circuit schematic of the modular track simulation unit illustrated in FIG. 4.

The male plug 20 is sized to fit within and be maintained by a female plug 60 on another unit 10 (or unit 110 illustrated in FIGS. 4-6). Likewise, the female plug 60 is sized to accept and maintain a male plug 20 on another unit 10 (or unit 110 illustrated in FIGS. 4-6). This way, modular track simulation units 10 (and/or units 110 illustrated in FIGS. 4-6) disclosed herein can be connected together using the plugs 20, 60 to form a system (e.g., system 200 illustrated in FIG. 7) as will be discussed below.

In the illustrated embodiment, the unit 10 includes three test points 30, 40, 50. It should be appreciated that the unit 10 could have more or less test points if desired. The first test point 30 includes first and second posts 32, 34. The posts 32, 34 have first ends that will be positioned on the top 14 of the housing 12 and second ends that can be fed through a first set of respective holes in the top 14. The first ends have openings for receiving plug or other connector. The second ends of the posts 32, 34 can be maintained within the housing 12 by screws or other suitable mechanisms such that the posts 32, 34 are held in position with respect to the top 14. The second ends of the posts 32, 34 will also be connected to other components within the housing 12 as is discussed below in more detail. In some implementations, the posts 32, 34 have a cross-hole and are respectively covered by binding covers 36, 38 that can be used to connect a wire or wires to the posts 32, 34 (e.g., by threading binding covers 36, 38 over the wire and posts 32, 34) if the wires are not connected to a plug that fits within the posts 32, 34. In this configuration, the first test point 30 would comprise binding posts.

The second test point 40 includes first and second posts 42, 44. The posts 42, 44 have first ends that will be positioned on the top 14 of the housing 12 and second ends that can be fed through a second set of respective holes in the top 14. The first ends have openings for receiving plug or other connector. The second ends of the posts 42, 44 can be maintained within the housing 12 by screws or other suitable mechanisms such that the posts 42, 44 are held in position with respect to the top 14. The second ends of the posts 42, 44 will also be connected to other components within the housing 12 as is discussed below in more detail. In some implementations, the posts 42, 44 have a cross-hole and are respectively covered by binding covers 46, 48 that can be used to connect a wire or wires to the posts 42, 44 (e.g., by threading binding covers 46, 48 over the wire and posts 42, 44) if the wires are not connected to a plug that fits within the posts 42, 44. In this configuration, the second test point 40 would comprise binding posts.

The third test point 50 includes first and second posts 52, 54. The posts 52, 54 have first ends that will be positioned on the top 14 of the housing 12 and second ends that can be fed through a third set of respective holes in the top 14. The first ends have openings for receiving plug or other connector. The second ends of the posts 52, 54 can be maintained within the housing 12 by screws or other suitable mechanisms such that the posts 52, 54 are held in position with respect to the top 14. The second ends of the posts 52, 54 will also be connected to other components within the housing 12 as is discussed below in more detail. In some implementations, the posts 52, 54 have a cross-hole and are respectively covered by binding covers 56, 58 that can be used to connect a wire or wires to the posts 52, 54 (e.g., by threading binding covers 56, 58 over the wire and posts 52, 54) if the wires are not connected to a plug that fits within the posts 52, 54. In this configuration, the third test point 50 would comprise binding posts.

The test points 30, 40, 50 are adapted to receive plugs such as e.g., single banana plugs, dual banana plugs and dual banana plugs with a shorting bar (i.e., a bar that shorts the plugs together). As mentioned above, in some implementations, wires without plugs (or wires that were previously connected to plugs that did not fit within the posts 32, 34, 42, 44, 52, 54 of the test points 30, 40, 50) can also be attached to the posts 32, 34, 42, 44, 52, 54 via the respective binding covers 36, 38, 46, 48, 56, 58. Thus, the test points 30, 40, 50 can be used to connect external components and/or circuitry to the unit 10 for calibration, ballast and train simulations. Thus, the unit 10 can be setup and modified quickly for a particular simulation using the test points 30, 40, 50.

In some implementations, the top 14 can include a first label 70 or other indicator identifying e.g., the length of track the unit 10 is set up to simulate. In the illustrated embodiment, the first label 70 describes the track length as "150 feet," by way of example. In some implementations, the unit 10 can simulate a track length of 25, 50, 100, 150, 200, 300, 400, 500, 1,000, 2,000, 3,000, 4,000 or 5,200 feet, by way of example. In addition, the unit 10 could be identified by a part number that also incorporates the track length the unit 10 simulates (e.g., part number 8000-80770-XXXX, where the XXXX indicates the length of track being simulated). It should be appreciated that the disclosed embodiments should not be so limited and that any track length can be simulated in accordance with the disclosed principles based on the impedances used within the housing 12.

The top 14 may also include a second label 72 or other indicator identifying the type of unit (i.e., what type of track circuit the unit is simulating). In the illustrated embodiment, the second label 72 describes the track circuit as an "Island Module," by way of example. As is known in the art, an island circuit is a short portion of a railroad track located at a crossing. Thus, the second label 72 can be used to identify a unit 10 that is suitable to simulate an island circuit (referred to herein as an "Island Module"). It is known that track circuits also include approach circuits, which are typically located adjacent to and on the sides of the island circuit. Thus, the second label 72 can be used to identify a unit 10 that is suitable to simulate an approach circuit (referred to herein an "Approach Module").

Figure 2:
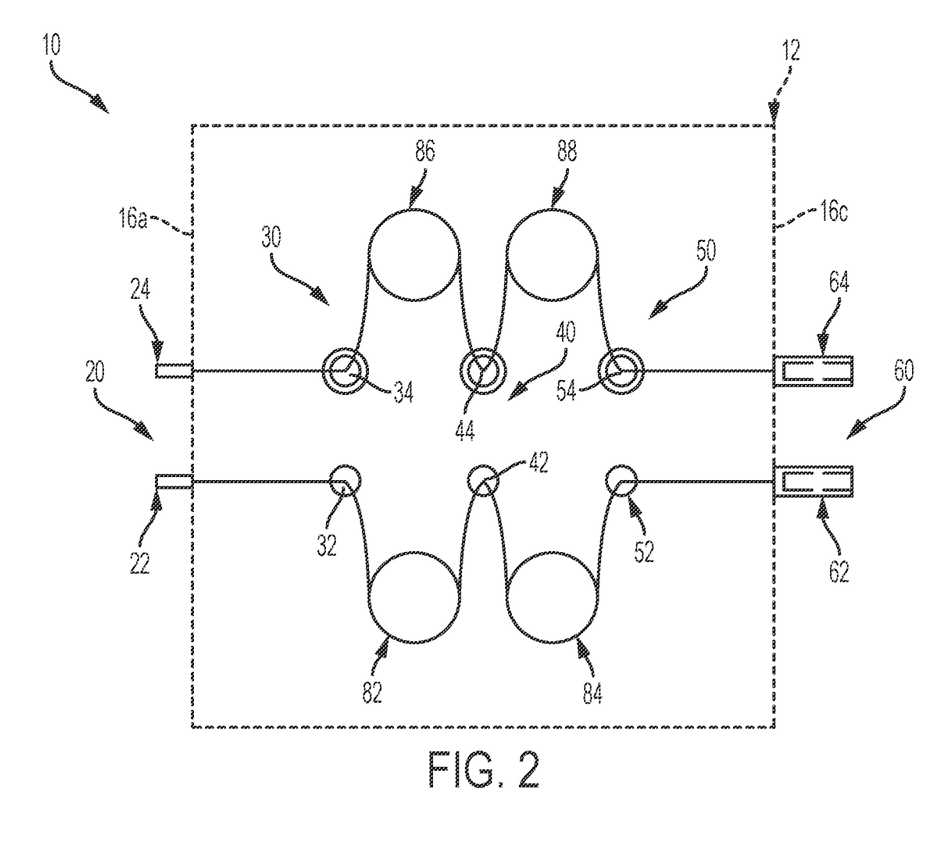
FIG. 2 illustrates example connections between components of the modular track simulation unit illustrated in FIG. 1.
Figure 3:
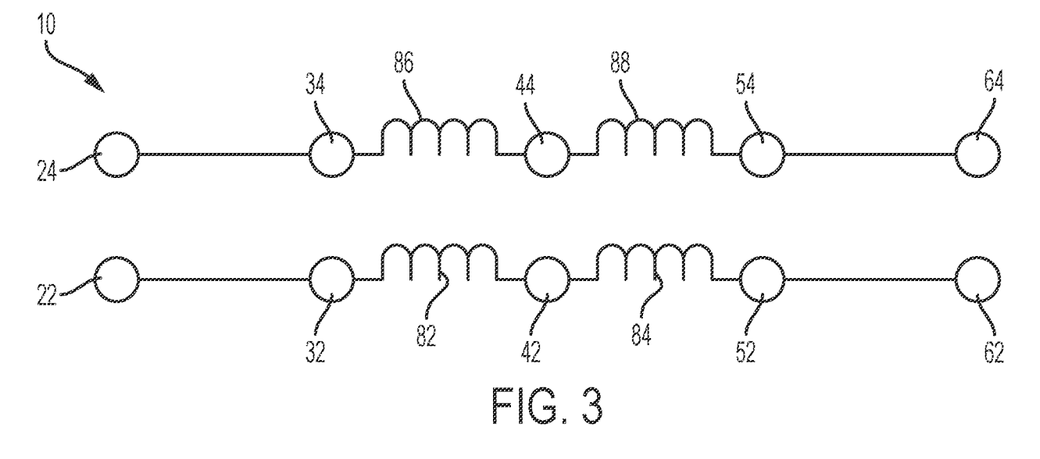
FIG. 3 illustrates an example circuit schematic of the modular track simulation unit illustrated in FIG. 1.

FIG. 2 illustrates example connections between components of the modular track simulation unit 10 illustrated in FIG. 1 while FIG. 3 illustrates an example circuit schematic of the modular track simulation unit 10 illustrated in FIG. 1. In the illustrated example, the first stud 22 of the male plug 20 is electrically connected to the first post 32 of the first test point 30. It should be appreciated that any type of connecting medium (e.g., wire, printed circuit board connection) can be used for this and any electrical connections described herein. The first post 32 of the first test point 30 is electrically connected to one end of a first inductor 82. The second end of the first inductor 82 is electrically connected to the first post 42 of the second test point 40. The first post 42 of the second test point 40 is electrically connected to one end of a second inductor 84. The second end of the second inductor 84 is electrically connected to the first post 52 of the third test point 50. The first post 52 of the third test point is electrically connected to the first jack 62 of the female plug 60.

In addition, the second stud 24 of the male plug 20 is electrically connected to the second post 34 of the first test point 30. The second post 34 of the first test point 30 is electrically connected to one end of a third inductor 86. The second end of the third inductor 86 is electrically connected to the second post 44 of the second test point 40. The second post 44 of the second test point 40 is electrically connected to one end of a fourth inductor 88. The second end of the fourth inductor 88 is electrically connected to the second post 54 of the third test point 50. The second post 54 of the third test point is electrically connected to the second jack 64 of the female plug 60.

The inductances of the four inductors 82, 84, 86, 88 contained within the unit 10 will define the track length the unit 10 can simulate. As noted above, in some implementations, the unit 10 can be configured to simulate a track length such as e.g., 25, 50, 100, 150, 200, 300, 400, 500, 1,000, 2,000, 3,000, 4,000 or 5,200 feet. Accordingly, the inductances of the four inductors 82, 84, 86, 88 will depend upon the desired track length the unit 10 is designed to simulate. In some implementations, feet of track are correlated to an impedance $L_{ac}$ and frequency f using the following principle:

$$L_{ac}=0.556-3.70\times10^4 f+5.64\times10^{-7} f^2-2.77\times10^{-10} f^3 \quad (1)$$

Example inductances for a particular track length are listed in Table I:

TABLE I

| Track Length (feet) | Impedance (millihenries) |
|---|---|
| 25 | 0.012 |
| 50 | 0.025 |
| 100 | 0.050 |
| 150 | 0.075 |
| 200 | 0.10 |
| 300 | 0.15 |
| 400 | 0.20 |
| 500 | 0.25 |
| 1000 | 0.50 |
| 2000 | 1.00 |
| 3000 | 1.50 |
| 4000 | 2.00 |
| 5200 | 2.60 |

Figures illustrate 4-6 another example modular track simulation unit 110 constructed in accordance with the disclosed principles. As will become apparent, the unit 110 is configured to simulate a specific length of railroad track by one or more inductances placed within the unit 110. The unit 110 is modular and may connect to other units, simulating the same or different track length, to achieve a system simulating a desired length of track. In addition, the unit 110 will have test points for connections required to interact with a device being tested and/or to change operating conditions for the simulation. The unit 110 is similar to the unit 10 discussed above with respect to FIGS. 1-3 except that it only comprises two test points 130, 150.

The unit 110 comprises a housing 112 having a top 114, four side walls 116a, 116b, 116c, 116d and a bottom (not shown). The housing 112 can be made of the same materials used for the housing 12 discussed above with respect to FIG. 1. In addition, the housing 112 can have the same dimensions as the housing 12 discussed above with respect to FIG. 1. In some implementations, the top 114 can be removable and maintained on the walls 116a, 116b, 116c, 116d by a connecting mechanism such as e.g., screws. In addition to, or alternatively, once the unit 110 is configured as explained herein, the top 114 may be secured to the walls 116a, 116b, 116c, 116d by an adhesive or other permanent means.

In the illustrated embodiment, the unit 10 contains a male plug 120 comprising a first stud 122 and a second stud 124. In some implementations, the studs 122, 124 can be banana plug studs having first ends that can be fed through respective holes in the first wall 116a of the housing 112 and second ends that can be maintained within the housing 112 by screws or other suitable mechanisms such that the studs 122, 124 are held in position with at least a portion of the first ends extending from the first wall 116a as shown in FIG. 5. The second ends of the studs 122, 124 will also be connected to other components within the housing 112 as is discussed below in more detail.

In the illustrated embodiment, the unit 110 contains a female plug 160 comprising a first jack 162 and a second jack 164. In some implementations, the jacks 162, 164 can be banana plug jacks having first ends that can be fed through respective holes in the third wall 116c of the housing 112 and second ends that can be maintained within the housing 112 by screws or other suitable mechanisms such that the jacks 162, 164 are held in position with at least a portion of the first ends extending from the third wall 116c as shown in FIG. 5. The second ends of the jacks 162, 164 will also be connected to other components within the housing 112 as is discussed below in more detail.

The male plug 120 is sized to fit within and be maintained by a female plug 160 on another unit 110 (or unit 10). Likewise, the female plug 160 is sized to accept and maintain a male plug 120 on another unit 110 (or unit 10). This way, modular track simulation units 110 (or unit 10 illustrated in FIGS. 1-3) disclosed herein can be connected together using the plugs 120, 160 to form a system (e.g., system 200 illustrated in FIG. 7) as will be discussed below.

In the illustrated embodiment, the unit 110 includes two test points 130, 150. It should be appreciated that the unit 110 could have more or less test points if desired. The first test point 130 includes first and second posts 132, 134. The posts 132, 134 have first ends that will be positioned on the top 114 of the housing 112 and second ends that can be fed through a first set of respective holes in the top 114. The first ends have openings for receiving plug or other connector. The second ends of the posts 132, 134 can be maintained within the housing 112 by screws or other suitable mechanisms such that the posts 132, 134 are held in position with respect to the top 114. The second ends of the posts 132, 134 will also be connected to other components within the housing 112 as is discussed below in more detail. In some implementations, the posts 132, 134 have a cross-hole and are respectively covered by binding covers 136, 138 that can be used to connect a wire or wires to the posts 132, 134 (e.g., by threading binding covers 136, 138 over the wire and posts 132, 134) if the wires are not connected to a plug that fits within the posts 132, 134. In this configuration, the first test point 130 would comprise binding posts.

The second test point 150 includes first and second posts 152, 154. The posts 152, 154 have first ends that will be positioned on the top 114 of the housing 112 and second ends that can be fed through a second set of respective holes in the top 114. The first ends have openings for receiving plug or other connector. The second ends of the posts 152, 154 can be maintained within the housing 112 by screws or other suitable mechanisms such that the posts 152, 154 are held in position with respect to the top 114. The second ends of the posts 152, 154 will also be connected to other components within the housing 112 as is discussed below in more detail. In some implementations, the posts 152, 154 have a cross-hole and are respectively covered by binding covers 156, 158 that can be used to connect a wire or wires to the posts 152, 154 (e.g., by threading binding covers 156, 158 over the wire and posts 152, 154) if the wires are not connected to a plug that fits within the posts 152, 154. In this configuration, the second test point 150 would comprise binding posts.

The test points 130, 150 are adapted to receive plugs such as e.g., single banana plugs, dual banana plugs and dual banana plugs with a shorting bar (i.e., a bar that shorts the plugs together). As mentioned above, in some implementations, wires without plugs (or wires that were previously connected to plugs that did not fit within the posts 132, 134, 152, 154 of the test points 130, 150) can also be attached to the posts 132, 134, 152, 154 via the respective binding covers 136, 138, 156, 158. Thus, the test points 130, 150 can be used to connect external components and/or circuitry to the unit 110 for calibration, ballast and train simulations. Thus, the unit 110 can be setup and modified quickly for a particular simulation using the test points 130, 150.

Although not shown in the illustrated embodiment, the top 114 can include labels or other indicators identifying e.g., the length of track the unit 110 is set up to simulate. In some implementations, the unit 110 can simulate a track length of 25, 50, 100, 150, 200, 300, 400, 500, 1,000, 2,000, 3,000, 4,000 or 5,200 feet, by way of example. In addition, the unit 110 could be identified by a part number that also incorporates the track length the unit 110 simulates. The top 114 may also include a second label or other indicator identifying the type of unit (i.e., what type of track circuit the unit is simulating) as discussed above for the unit 10 illustrated in FIGS. 1-3.

Referring to FIGS. 5 and 6, in the illustrated example, the first stud 122 of the male plug 120 is electrically connected to the first post 132 of the first test point 130. The first post 132 of the first test point 130 is electrically connected to one end of a first inductor 182. The second end of the first inductor 182 is electrically connected to the first post 152 of the second test point 150. The first post 152 of the second test point 150 is electrically connected to the first jack 162 of the female plug 160.

In addition, the second stud 124 of the male plug 120 is electrically connected to the second post 134 of the first test point 130. The second post 134 of the first test point 130 is electrically connected to one end of a second inductor 184. The second end of the second inductor 184 is electrically connected to the second post 154 of the second test point 150. The second post 154 of the second test point 150 is electrically connected to the second jack 64 of the female plug 60.

The inductances of the two inductors 182, 184 contained within the unit 110 will define the track length the unit 110 can simulate as discussed above with respect to the unit 10 illustrated in FIGS. 1-3.

Figure 7:
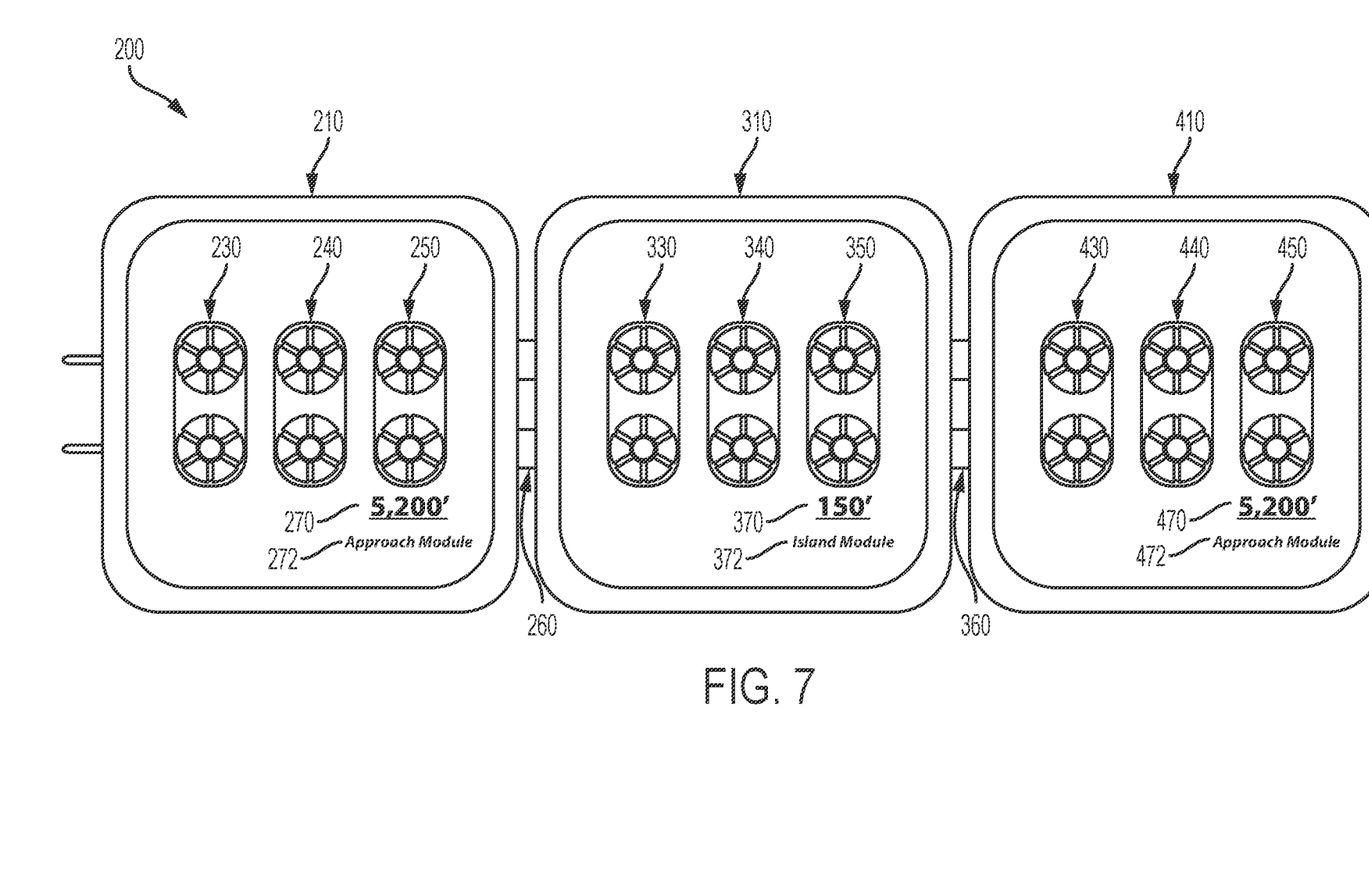
FIG. 7 illustrates an example track simulation system comprising a plurality of modular track simulation units constructed in accordance with the disclosed principles.

FIG. 7 illustrates an example track simulation system 200 comprising a plurality of modular track simulation units 210, 310, 410 constructed in accordance with the disclosed principles. In the illustrated example, the units 210, 310, 410 are constructed as described above with respect to FIGS. 1-3, each having a simulated track length. For example, the first unit 210 is configured to simulate a track having a length of 5,200 feet as indicated by its first label 270. The first unit 210 is identified as an Approach Module by the second label 272. In the illustrated example, the second unit 310 is configured to simulate a track having a length of 150 feet as indicated by its first label 370. The second unit 310 is identified as an Island Module by its second label 372. The third unit 410 is configured to simulate a track having a length of 5,200 feet as indicated by its first label 470. The third unit 410 is identified as an Approach Module by the second label 472. It should be appreciated that the system 200 could also include one or more units 110 as described with respect to FIGS. 4-6.

The first modular track simulation unit 210 is connected to the second unit 310, which is connected to the third unit 410 in accordance with the disclosed principles. That is, the male plug (not shown) of the second unit 310 is connected to the female plug 260 of the first unit 210. In addition, the male plug (not shown) of the third unit 410 is connected to the female plug 360 of the second unit 310. In the illustrated example, due to these connections the system 200 can be used to simulate 10,550 feet of track.

Moreover, the system 200 includes 9 test points 230, 240, 250, 330, 340, 360, 430, 440, 450 that can be used for various purposes. For example, the numerous test points 230, 240, 250, 330, 340, 360, 430, 440, 450 provide the ability to allow several devices to be connected to the system 100 at one or more times during a simulation. The system 200 may be connected to and test a grade crossing predictor, an AFO and/or other track circuit using one or more of the test points 230, 240, 250, 330, 340, 360, 430, 440, 450. In addition, the test points 230, 240, 250, 330, 340, 360, 430, 440, 450 can be used for calibration purposes of device being tested, simulate ballast and other environmental conditions to see if the device being tested is performing as expected or requires adjustments, run track simulations to ensure Federal regulations, standards and/or recommended practices are being adhered to.

As can be appreciated, the units 10, 110 and system 200 disclosed herein provide many advantages and benefits that are not obtainable by current railroad track simulators. For example, the modularity of the units 10, 110 provides a major improvement over today's fixed length simulators. That is, as many same or differently configured units 10, 110 can be connected to create a system 200 that simulates the exact track length the device being tested will be operating with. In addition, the system 200 can be easily re-configured by adding, removing or changing the types of units 10, 110 in the system 200. The modularity of the units 10, 110 also provides the ability to quickly change the system 200 for other devices and/or other operating conditions or tests. The numerous test points allow several devices to be connected to the system and can be used for calibration purposes of the testing device, simulate ballast and other environmental conditions to see if the testing device is performing as expected or requires adjustments, run track simulations, add or remove additional shunts (e.g., termination shunts often found at specified locations within a track circuit) to reconfigure the simulation, to name a few. This type of modularity and the quick and easy configuration and reconfiguration of system 200 is simply not achievable using current track simulators.

The foregoing examples are provided merely for the purpose of explanation and are in no way to be construed as limiting. Further areas of applicability of the present disclosure will become apparent from the detailed description, drawings and claims provided hereinafter. While reference to various embodiments is made, the words used herein are words of description and illustration, rather than words of limitation. Further, although reference to particular means, materials, and embodiments are shown, there is no limitation to the particulars disclosed herein. Rather, the embodiments extend to all functionally equivalent structures, methods, and uses, such as are within the scope of the appended claims.

Additionally, the purpose of the Abstract is to enable the patent office and the public generally, and especially the scientists, engineers and practitioners in the art who are not familiar with patent or legal terms or phraseology, to determine quickly from a cursory inspection the nature of the technical disclosure of the application. The Abstract is not intended to be limiting as to the scope of the present inventions in any way.

We claim:

1. A modular railroad track simulation unit comprising:
   a housing;
   a first plug formed through one side wall of the housing and a second plug formed through a second sidewall of the housing;
   a plurality of test points formed through a top of the housing, a first test point being electrically connected to the first plug and a second test point being electrically connected to the second plug; and at least one device within the housing having an inductance and being electrically connected between the first and second test points at locations within the housing,
wherein the inductance defines a railroad track length being simulated by the unit, and
wherein the test points are adapted to receive a plug connected to a device whose operation is being tested based on the track length being simulated by the unit.

2. The modular railroad track simulation unit of claim 1, wherein the test points are adapted to receive one or more wires connected to a device whose operation is being tested based on the track length being simulated by the unit.

3. The modular railroad track simulation unit of claim 1, wherein the test points are adapted to receive a plug or wires connected to a device for altering conditions of the track length being simulated by the unit.

4. The modular railroad track simulation unit of claim 1, wherein the unit comprises three test points formed through the top of the housing and the at least one device for providing inductance to the unit comprises a first inductance electrically connected between the first test point and the third test point and a second inductance electrically connected between the second test point and the third test point.

5. The modular railroad track simulation unit of claim 1, wherein the inductance corresponds to a track length selected from a group of track comprising 25, 50, 100, 150, 200, 300, 400, 500, 1,000, 2,000, 3,000, 4,000 and 5,200 feet.

6. The modular railroad track simulation unit of claim 1, wherein the second plug of the unit is adapted to receive a first plug from a second unit.

7. A modular railroad track simulation unit comprising:
a housing;
a first plug formed through one side wall of the housing and a second plug formed through a second sidewall of the housing;
a plurality of test points formed through a top of the housing; and
a plurality of inductors located within the housing,
wherein a first test point is electrically connected between the first plug and a first inductor, the second test point is electrically connected between the first inductor and a second inductor, and the third test point is electrically connected between the second inductor and the second plug,
wherein a combined inductance of the first and second inductors defines a railroad track length being simulated by the unit, and
wherein the test points are adapted to receive a plug connected to a device whose operation is being tested based on the track length being simulated by the unit.

8. The modular railroad track simulation unit of claim 7, wherein the test points are adapted to receive one or more wires connected to a device whose operation is being tested based on the track length being simulated by the unit.

9. The modular railroad track simulation unit of claim 7, wherein the test points are adapted to receive a plug or wires connected to a device for altering conditions of the track length being simulated by the unit.

10. The modular railroad track simulation unit of claim 7, wherein the inductance corresponds to a track length selected from a group of track comprising 25, 50, 100, 150, 200, 300, 400, 500, 1,000, 2,000, 3,000, 4,000 and 5,200 feet.

11. A modular railroad track simulation system comprising:
a plurality of railroad track simulation modules, each module comprising:
a housing;
a first plug formed through one side wall of the housing and a second plug formed through a second sidewall of the housing;
a plurality of test points formed through a top of the housing, a first test point being electrically connected to the first plug and a second test point being electrically connected to the second plug; and
at least one device within the housing having an inductance and being electrically connected between the first and second test points at locations within the housing,
wherein a second plug of a first module of the plurality of modules is connectable to a first plug from a second module of the plurality of modules, and the system simulates a railroad track length based on a combined inductance of the plurality of railroad track simulation modules.

12. The system of claim 11, wherein the test points are adapted to receive a plug connected to a device whose operation is being tested based on the track length being simulated by the system.

13. The system of claim 11, wherein the test points are adapted to receive one or more wires connected to a device whose operation is being tested based on the track length being simulated by the system.

14. The system of claim 11, wherein the test points are adapted to receive a plug or wires connected to a device for altering conditions of the track length being simulated by the system.

15. The system of claim 11, wherein each module comprises three test points formed through the top of the housing and the at least one device for providing inductance to the module comprises a first inductance electrically connected between the first test point and the third test point and a second inductance electrically connected between the second test point and the third test point.

16. The system of claim 11, wherein the inductance of each module corresponds to a track length selected from a group of track comprising 25, 50, 100, 150, 200, 300, 400, 500, 1,000, 2,000, 3,000, 4,000 and 5,200 feet.

17. The system of claim 11, wherein each module comprises one of an island circuit or an approach circuit.

* * * * *